United States Patent
Knapp

(10) Patent No.: US 6,470,486 B1
(45) Date of Patent: Oct. 22, 2002

(54) METHOD FOR DELAY-OPTIMIZING TECHNOLOGY MAPPING OF DIGITAL LOGIC

(75) Inventor: David Knapp, San Jose, CA (US)

(73) Assignee: Get2Chip, San Jose, CA (US)

( * ) Notice: Subject to any disclaimer, the term of this patent is extended or adjusted under 35 U.S.C. 154(b) by 0 days.

(21) Appl. No.: 09/574,693

(22) Filed: May 17, 2000

Related U.S. Application Data

(60) Provisional application No. 60/136,127, filed on May 26, 1999.

(51) Int. Cl.$^7$ ................................................ G06F 17/50
(52) U.S. Cl. .............................. 716/18; 716/10; 716/8; 716/7; 716/6; 716/3; 716/2
(58) Field of Search ........................................ 716/1–21

(56) References Cited

U.S. PATENT DOCUMENTS

| | | | | |
|---|---|---|---|---|
| 4,698,760 A | * | 10/1987 | Lembach et al. ............ 364/490 |
| 5,031,111 A | * | 7/1991 | Chao et al. .................. 364/491 |
| 5,218,551 A | * | 6/1993 | Agrawal et al. ............. 364/491 |
| 5,237,514 A | * | 8/1993 | Curtin ......................... 364/490 |
| 5,408,663 A | * | 4/1995 | Miller ......................... 395/650 |
| 5,459,673 A | * | 10/1995 | Carmean et al. ............ 364/489 |
| 5,619,420 A | * | 4/1997 | Breid .......................... 364/491 |
| 5,768,594 A | * | 6/1998 | Blelloch et al. ............. 395/706 |
| 5,831,864 A | * | 11/1998 | Raghunathan et al. ...... 364/488 |
| 5,862,149 A | * | 1/1999 | Carpenter et al. .......... 371/22.3 |
| 5,870,308 A | * | 2/1999 | Dangelo et al. ............. 364/489 |
| 5,903,471 A | * | 5/1999 | Pullela et al. ............... 364/490 |

* cited by examiner

Primary Examiner—Vuthe Siek
Assistant Examiner—Andrea Liu
(74) Attorney, Agent, or Firm—Michael A. Glenn

(57) ABSTRACT

A delay-optimizing technology-mapping process for an electronic design automation system selects the best combination of library devices to use in a forward and a backward sweep of circuit trees representing a design. A technology selection process in an electronic design automation-system comprises the steps of partitioning an original circuit design into a set of corresponding logic trees. Then, ordering the set of corresponding logic trees into an ordered linear list such that each tree-T that drives another ordered tree precedes the other ordered tree, and such that each ordered tree that drives the tree-T precedes the tree-T. Next, sweeping forward in the ordered linear list while computing a set of Pareto-optimal load/arrival curves for each of a plurality of net nodes that match a technology-library element. And, sweeping backward in the ordered linear list while using the set of Pareto-optimal load/arrival curves for each of the net nodes and a capacitive load to select a best one of the technology-library elements with a shortest signal arrival time. Wherein, only those net nodes that correspond to gate inputs are considered, and any capacitive loads are predetermined.

4 Claims, 4 Drawing Sheets

METHOD FOR DELAY-OPTIMIZING TECHNOLOGY MAPPING OF DIGITAL LOGIC

This application claims the benefit of provisional application No. 60/136,127, filed May 26, 1999.

BACKGROUND OF THE PRESENT INVENTION

1. Technical Field

The present invention relates to electronic design automation and more particularly to delay-optimizing technology-mapping in the high-level synthesis of digital systems.

2. Description of the Prior Art

High-level synthesis (HLS) automates certain sub tasks of a digital system design in an electronic design automation (EDA) system. A system architect begins by designing and validating an overall algorithm to be implemented, e.g., using "C", "C"++, a specialized language, or a capture system. The resulting architectural specification is partitioned into boards, chips, and blocks. Each block is a single process having its own control flow. There are usually tens to hundreds of such blocks in a modem large-scale chip design. Typical blocks represent whole filters, queues, pipeline stages, etc. Once a chip has been partitioned into its constituent blocks, any needed communication protocols have to be constructed. Such protocols depend on cycle-by-cycle communication between blocks.

So-called "scheduling" and "allocation" are applied one block at a time. Scheduling assigns operations such as additions and multiplications to states of a finite-state machine (FSM). Such FSM describes a control flow in an algorithm performed by a block being synthesized. Some operations are locked into particular states, and represent communication with other blocks. These input/output operations cannot be moved, or rescheduled, from one state to another, because to do so would probably upset the block-to-block communication protocol.

However, some other operations can be moved from one state to another. Moving operations from states that have many operations to states that have few allows hardware resources to be more evenly shared among operations. Timing problems can sometimes be resolved by moving certain operations from states in which operation delays cause timing problems into states in which such problems don't exist.

Allocation maps the operations of a scheduled FM to particular hardware resources. For example, three addition operations can be scheduled to only require a single adder. An appropriate adder is constructed, and the operations are assigned to the adder in a schedule. But complications can arise when more than one hardware resource of a given bit-width and function is needed. And so which resource to use for each operation must be decided. Considerations include multiplexing cost, the creation of false timing paths, register assignment, and even using large resources for small operations. Hardware resources can be used for multiple functions. Calculating a minimum set of resources for an entire process is difficult but rewarding. Sometimes alternative implementations will be possible. It is often possible to choose implementations that meet the overall timing resources (abstract functions) to gate level implementations.

Allocation includes calculating a register set and assigning data to registers for use in later states. For example, temporary variables are used to store intermediate results in a larger calculation. But the contents of such temporary variables could share a common register in different states. The contents are only needed in one state each. So it is possible to save on hardware by assigning the data that needs to be stored to such storage elements. But register and storage allocations can be complicated if data values can form mutually exclusive sets or can share storage. Data values often drive functional resources, and in turn are often produced by functional resources. A good assignment of data to storage will complex by the fact that there are many ways to map an individual Boolean gate, and each way has its own unique advantages.

Technology-independent, or Boolean, optimization follow scheduling and allocation. The circuit design comprises generic AND and OR gates connected in a netlist. Technology-independent optimization minimizes the number of literals in the netlist. An abstraction of Boolean gates lends itself to a highly mathematical treatment based on Boolean arithmatic. For example, the Boolean identity AB+AC=A(B+C) can be used to reduce the corresponding gate network. Technology mapping follows Boolean optimization, the abstract Boolean gates of the circuit are mapped to standard cells from a technology library. Standard library cells include simple AND, OR, or NOT functions, and much more complex functions. For example, full adders, and-or-invert gates, and multiplexers. Technology-library gates are available in a variety of drive strengths, delays, input loadings, etc. Technology mapping is made more complex by the fact that there are many ways to map an individual Boolean gate, and each way has its own unique advantages.

Technology mapping can sometimes be avoided by constructing custom gate layouts for the gates of a circuit, instead of selecting cells from a library of preconstructed and precharacterized cells. But this method is not commonly associated with automatic synthesis.

The layout tasks of cell placement and net routing follow technology mapping, the physical position of each cell on the chip is established (placement), and the nets necessary to interconnect the cells are laid out (routing). In application service provider 104, the design intellectual property is downloaded to the user for placing and routing.

An abstract Boolean netlist is technology-mapped to standard-cell library elements, and involves matching and selection. A gate or a small collection of gates in a netlist is tested for logical equivalence to an element of the technology library to find a match. Matching can be done on an individual gate basis, or on a collection of gates. For example, there might be an AND-OR-INVERT gate in a technology library that would be capable of implementing an entire example netlist. Matching can also be partial, as in the case of a three-input gate in a technology library that could be used to implement a two-input gate in a netlist by tying one of its inputs to a constant.

Given that each of the gates of a netlist can be implemented by one or more gates from a technology library, one of the matches must be selected. Such a selection must "cover" the netlist. Each gate of the netlist must have a selected matching element. The circuit derived by replacing each abstract gate with its selected matching technology library gate must be logically equivalent to the original circuit. The derived circuit should minimize overall area, delay, and/or other properties, while obeying any design rules imposed by the library or the designer. The technology mapping phase is completed when all the abstract gates of a netlist have been replaced by equivalent technology library elements.

A final phase of logic synthesis is an optional iterative improvement. In this step, the entire netlist is optimized, a few gates at a time, by making local changes. One way to do this is represented by, repeat {
        choose a gate G
        try alternative mappings of G, keeping any improvement
    } until no further improvements can be found.

Each iterative improvement step can be slow, because a large number of alternative selections could be constructed, even for a small circuit. For example, in a circuit that has ten gates, each of which have ten possible technology matches. If all combinations are considered, there would be 1,010 possible implementations of the circuit. Depending on the circuit's topology and the properties of the library elements, the effects of alternative mappings can interact. Each gate might have to be visited many times before no further improvement could be obtained.

Attempts at iterative improvements can also be unreliable, as a good circuit may never be found. A local minima can occur, in which counter-intuitive "uphill moves" must be made that degrade the circuit in order to enable other changes that will have a desirable overall effect. If the uphill moves needed are outside the iterative improvement algorithm's horizon, the process gets stuck and cannot improve the circuit beyond a certain point even though a better solution might exist.

There are conventional ways to address the local minima problem, e.g., simulated annealing and randomized search. But the prior art techniques are too slow. What is needed is a method that makes a good initial selection, so iterative improvement cycles can be skipped altogether.

FIG. 1 refers to a general graph-matching problem 100, where there are two graphs, a pattern graph 102 $G_1=(v_1, e_1)$, and a target graph 104 $G_2=(v_2, e_2)$. The goal is to find a one-to-one mapping 106 from the elements of the pattern to the elements of the target graph. A subgraph of $G_2$, defined by the matched nodes, must be isomorphic to $G_1$. An example of such a matching is shown here, with the matched nodes and arcs shown in an envelope 108.

FIG. 2 illustrates a circuit 202 and its corresponding bipartite graph representation 204. In essence, the gates are converted to nodes, and the interconnects to arcs. The particular technology-mapping matching problem differs from the more general problem of matching. Graphs extracted for circuits are directed bipartite graphs, e.g., $G=(V_1, v_2, e)$, where edges in "e" connect elements of $v_1$ to elements of $v_2$, but never elements of $v_1$ to $v_1$ or elements of $v_2$ to $v_2$. The edges are ordered pairs, e.g., they have a direction. The nodes in $v_2$ represent gates, and the nodes in $v_1$ represent circuit nets. Graph matching for bipartite directed graphs is such that a net node can only map to a net node, a gate node can only map to a gate node, and isomorphism is used to preserve the direction of edges. The nodes in bipartite graph representation 204 that represent gates have types, e.g., AND (^), OR (v), and NOT (!). These form part of the isomorphism construction. A node of type X in $G_1$ is mapped to a node of type X in $G_2$.

The prior art usually only matches trees. Directed acyclic graphs (DAG's) can be used to represent some types of multiple-output gates, and so combinational logic circuits can be represented by a DAG. That is, as long as they contain no cycles. DAG's must also be well-formed and avoid including cyclic false paths.

FIG. 3 illustrates a first step in technology mapping which is to partition a network graph 302 into a collection of trees 304–308 or DAG's. Each tree 304–308 can then be worked on as an individual mapping problem. The simplest formulation is to use trees, but an extension to DAG's would not be difficult. In general, the trees are defined so that their roots and leaves are all net nodes, as opposed to gate nodes. Root and leaf nodes are duplicated as many times as necessary, otherwise they will have to be shared between trees. The trees 304–308 should be as large as possible, e.g., maximal trees. In any extension to DAG's, the number of output terminals of a DAG must be limited to two, or other small number. Otherwise, the matching computations get too complex.

A typical technology library includes a number of cells that represent primitive elements. Combinational cells in the library have Boolean functions. A selection of bipartite directed a graph representations is constructed for each cell. Each of these graphs is associated with the cell's Boolean function expressed in a small primitive-type alphabet. One convenient alphabet of primitive type is that of two-input NAND gates and inverters. Each cell of the library is described by a tree (or DAG) comprising only net nodes, two-input NAND nodes, and NOT nodes. The exact alphabet chosen is not crucial as long as it is relatively simple, and it is logically complete. All Boolean functions can be expressed as networks comprising only units of the alphabet.

Such a decomposed library is shown in FIG. 4. Cell names are listed in the left column. The middle column lists the corresponding Boolean functions. And each cell is represented by one or more pattern trees as shown in the right column.

Any circuit designs submitted to technology mapping processes are usually represented as networks of simple gates, e.g. NAND, AND, NOR, OR, XOR, and NOT. Each network can be converted to a functionally equivalent network using only the library-tree gate types and fan-ins. For the example library of FIG. 4, the circuit would be converted into an equivalent circuit comprising only inverters and two-input NAND gates. It is then mapped into a bipartite directed graph representation, e.g., in the same style as the library-pattern graphs. After that, it is possible to do the graph matching. Both the library cells and the circuit to be mapped are represented using the same graph formalism.

The trees of a circuit are individual matching problems. Any matching results are preferably encoded by attaching a list of matching pattern trees to each net node N. Such list represents a set of pattern trees whose roots match N. The following pseudocode implements such, and refers to this list as matchings(N),

---

Let R be the root of a circuit tree T.
Let S be a set comprising initially only of R.
While (S is nonempty) {
    Let N be an element of S. Remove N from S.
    For (all members P of the set of pattern trees in the library)
        If (matches(root(P), N)) {
            Add M to matchings(N).
        }
    }
if (N is not a leaf node of T) {
    Let G be the driver of N.
    Add all drivers of G to S.
    }
}

---

There are a number of ways to implement a tree-matching test with pattern-matching algorithms. For example, a recursive algorithm can recognize that a circuit tree matches a pattern tree if the roots match, and all the circuit-tree subtrees map to all the pattern-tree subtrees in matching pairs. The subtree mapping must be one-to-one circuit subtrees to pattern subtrees, each subtree of a circuit tree must map to exactly one subtree of a pattern tree. Every subtree of the pattern tree must be mapped to by some subtree of the circuit tree, e.g., "onto" mapping. Without this, more than one subtree of the circuit tree might b e mapped to a single subtree of the pattern tree, or fail to map to some subtree of the pattern at all.

If one matching of subtree to subtree fails, another might succeed. The trees might be asymmetric. All permutations of the ordered list of subtrees of the pattern tree are tested against the ordered list of subtrees of the circuit tree. If all permutations fail, the match attempt as a whole is abandoned. A match is found if any permutation succeeds.

The following pseudocode implements a matching algorithm. All of the named nodes are net nodes. The gate nodes are net node drivers. A list "U" referred to in the if statement is a list of drivers of drivers of the net N, e.g., drivers of gate G that drive net node N. "M" is a net node of the pattern tree, and "N" is a net node of the circuit tree.

```
If(M is a leaf node) {
    Return true.
{else if (N is a leaf node) {
    Return false.
}else if (the type of the driver of M is the same as the type of
the driver of N) {
    For (all permutations P of the list of drivers of the driver of M) {
        Temp = true;
        Let U be the list of drivers of the driver of N.
        For (all elements p of P, and u of U, in order) {
            If (matches(p, U) is false) {
                Temp = false;
                Go to Continue.
            }
        }
    Continue:
        If (Temp) {
            (P, U) is a successful one-to-one and onto mapping.
            Return true.
        }
    }
    If you get to this point there is no one-to-one and onto mapping.
    Return false.
}else{
    Return false.
}
```

In this form, such algorithm becomes increasingly expensive as the fan-in of the technology library cells increase. The complexity is exponential. The algorithm can be sped up, but this one is fast enough for most current technology libraries.

The matching step produces a one-to-many mapping from the net nodes of the circuit to root nodes of pattern trees. Such mapping candidates are functions that take a net node as their argument, and return a list of pattern trees. An implementation of the circuit becomes a set of net nodes, for which one member of the candidate set is selected. The set of net nodes chosen will usually be smaller than the entire set of net nodes because some net nodes will be "buried" inside patterns that have interior net nodes.

FIG. 5 shows a circuit tree on the right, and the only two pattern trees on the left that are needed to match every part of the circuit tree. Each of the possible matches of a pattern tree to a piece of the circuit tree net nodes is shown as a dashed line. Thus the entire circuit can be "covered" with as few as four gates if a proper subset of six matchings shown is chosen. In other words, the circuit tree can be decomposed into four constituent gate types. Subsets of the six matchings shown could produce redundant or incomplete coverings. The challenge is to select a subset of the matchings that minimizes delay and redundancy, and that covers.

Prior art devices and methods are unsatisfactory when it comes to covering while minimizing delay and keeping redundancy down.

SUMMARY OF THE PRESENT INVENTION

Briefly, a delay-optimizing technology-mapping process embodiment of the present invention for an electronic design automation system selects the best combination of library devices to use in a forward and a backward sweep of circuit trees representing a design. A technology selection process in an electronic design automation system comprises the steps of partitioning an original circuit design into a set of corresponding logic trees. Then, ordering the set of corresponding logic trees into an ordered linear list such that each tree-T that drives another ordered tree precedes the other ordered tree, and such that each ordered tree that drives the tree-T precedes the tree-T. Next, sweeping forward in the id ordered linear list while computing a set of Pareto-optimal load/arrival curves for each of a plurality of net nodes that match a technology-library element. And, sweeping backward in the ordered linear list while using the set of Pareto-optimal load/arrival curves for each of the net nodes and a capacitive load to select a best one of the technology-library elements with a shortest signal arrival time. Wherein, only those net nodes that correspond to gate inputs are considered, and any capacitive loads are predetermined.

DETAILED DESCRIPTION OF THE PRESENT INVENTION

Figure 1:
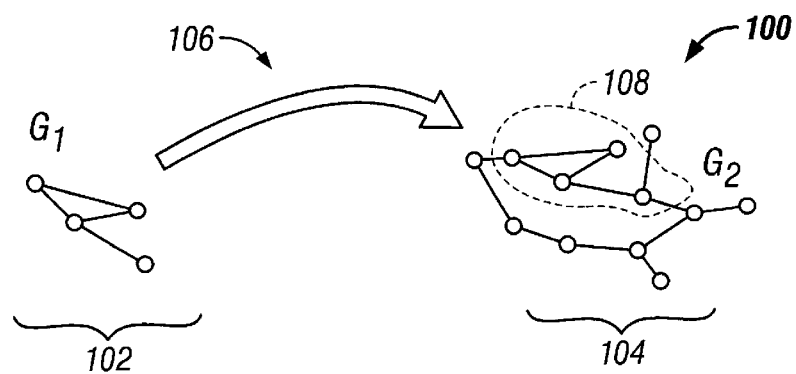
FIG. 1 is a diagram of a general graph-matching problem in electronic design automation.
Figure 2:
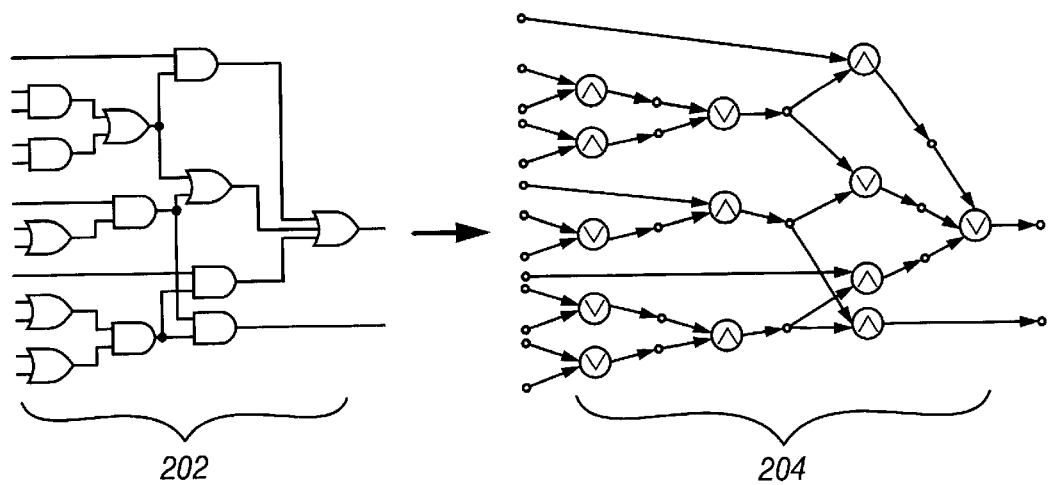
FIG. 2 is a diagram of a circuit and its corresponding bipartite graph representation.
Figures 3, 4:
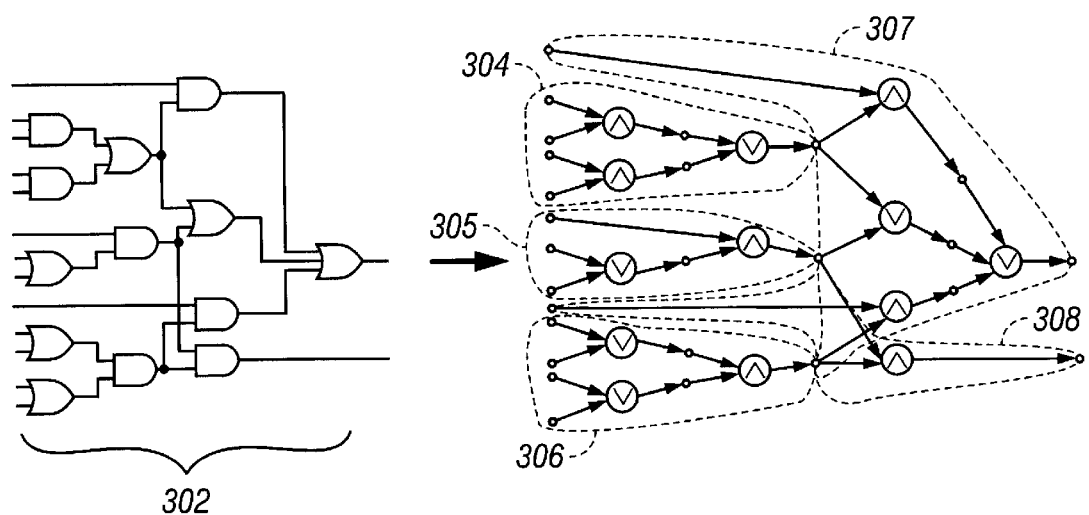
FIGS. 3 is a diagram of a first step in technology mapping which is to partition a network graph into a collection of trees.
FIG. 4 is a diagram representing a decomposed technology library.
Figure 5:
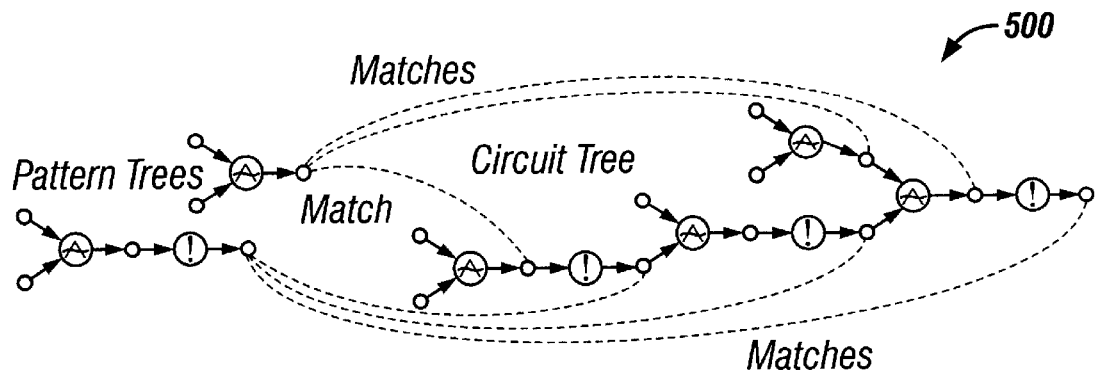
FIG. 5 diagrams a circuit tree on the right , and the only two pattern trees on the left that are needed to match every part of the circuit tree.
Figure 6:
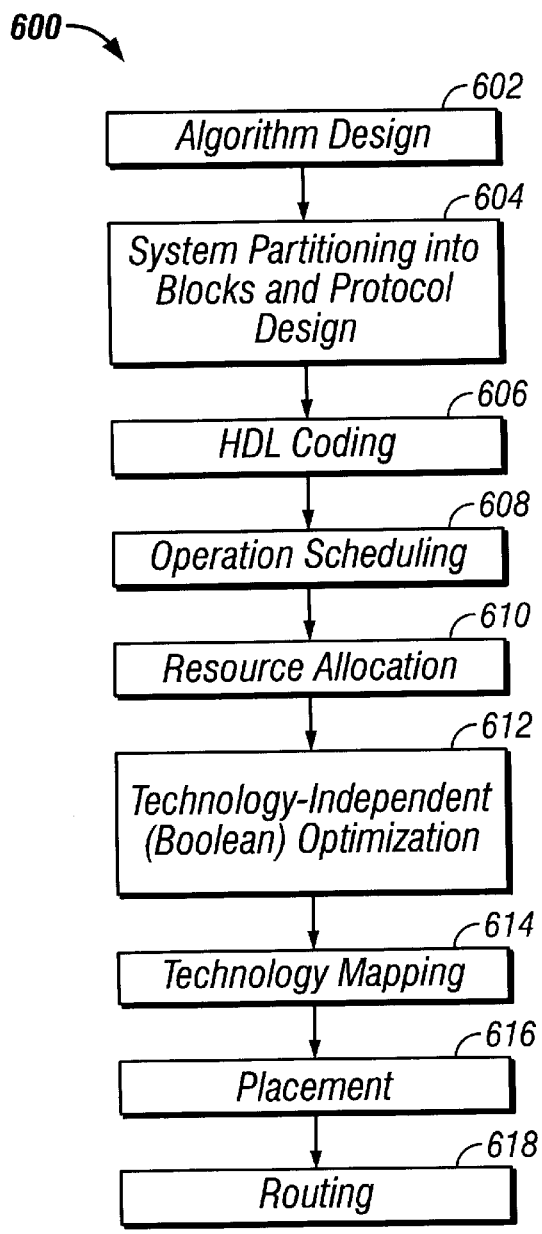
FIG. 6 is a diagram of an electronic design automation (EDA) method embodiment of the present invention.

FIG. 6 represents an electronic design automation (EDA) method embodiment of the present invention, and is referred to herein by the general reference numeral 600. The EDA method begins with an algorithm design step 602. The system design is partitioned into blocks and protocol design in a step 604. Verilog or other kind of hardware description language (HDL) coding is done in a step 606. A high-level synthesis (HLS) includes an operation scheduling step 608 and a resource allocation step 610. A timing analysis is applied each time an individual operation is scheduled, and may be called many times to get a single operation scheduled. A technology-independent (Boolean) optimization step 612 follows. A technology mapping step 614 maps the abstract Boolean gates of the circuit to standard cells from a technology library, for example. A placement step 616 locates the gates on the chip real estate, and a routing step 618 interconnects them with wires.

Figure 7:
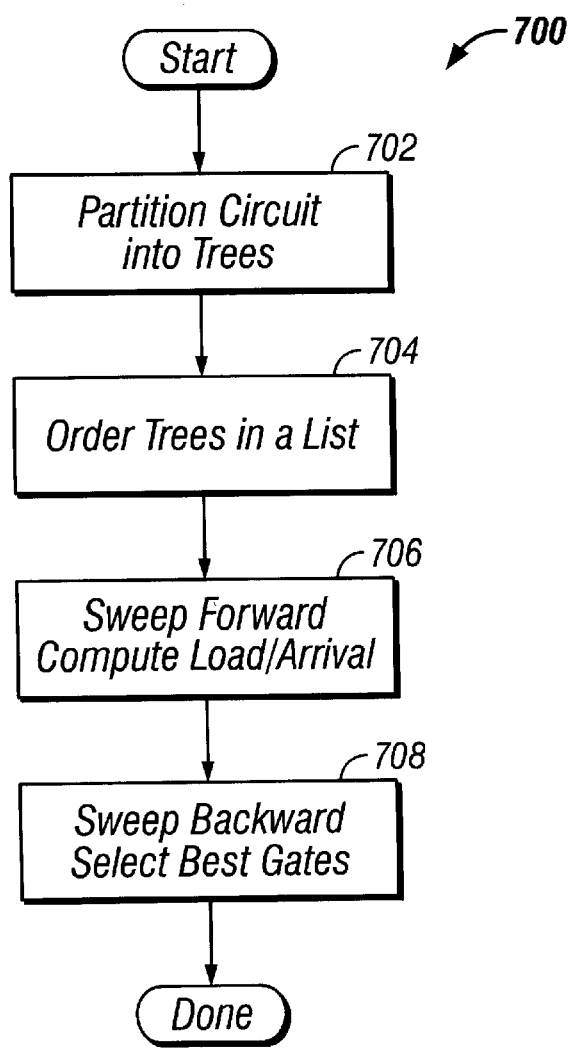
FIG. 7 is a diagram of a covering selection method embodiment of the present invention.

FIG. 7 represents a covering selection method embodiment of the present invention, and is referred to herein by the general reference numeral 700. In a step 702, a circuit is partitioned into trees. In a step 704, such trees are ordered using a topological sorting algorithm. A depth-first graph traversal algorithm can be used. A rule of ordering states that a tree "Tree" must precede all trees whose leaves "L" it drives, and it must succeed all trees that drive any leaves "L" of tree "T". This ordered list of trees is called "O".

In a step 706, a sweep forward in the ordered linear list is made while computing a set of Pareto-optimal load/arrival curves for each of a plurality of net nodes that match a technology-library element. In a step 708, a sweep backward in the ordered linear list is made while using the set of Pareto-optimal load/arrival curves for each of the net nodes and a capacitive load to select a best one of the technology-library elements with a shortest signal arrival time. Only net nodes that correspond to a gate input are considered, and any capacitive loads are always predetermined.

Figure 8:
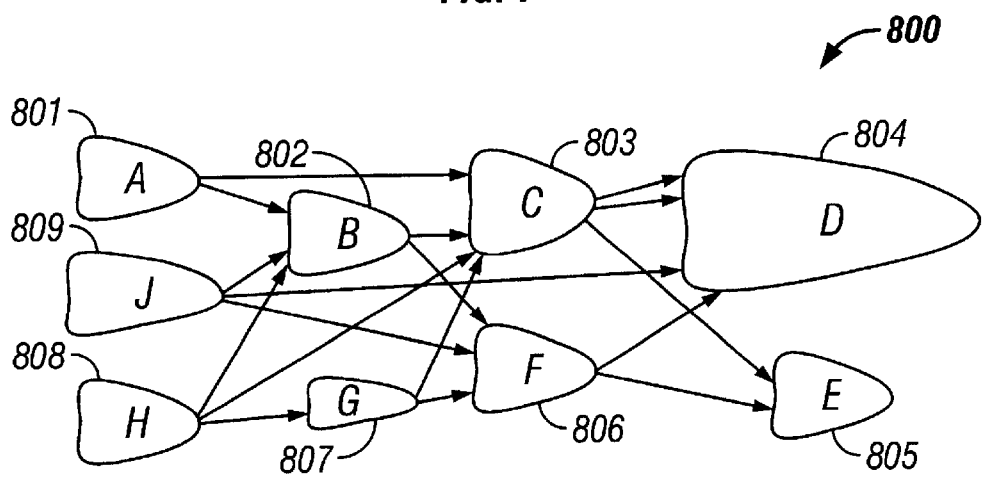
FIG. 8 is a diagram representing the partitioning of a circuit into trees, and the ordering of those trees into a list that conforms to a basic rule.

Such trees "T" representing a circuit and an ordered list is represented in FIG. 8. A first tree 801 in "O" is arbitrarily labeled "A". The other trees 802–806 are labeled "B" through "J". A topological ordering of the trees that satisfies the rule is A, H, G, J, B, C, F, E, D. Since trees-A, J, and H are at the input boundary, no other trees can drive any of trees-A, J, or H. So it is permissible under the rule to place tree-A at the head of the ordered list "O". The ordering of trees A, H, G, J, B, C, F, E, D allows each tree to be evaluated in an order where no tree will have a still-to-be-evaluated input tree.

At the input boundary, the signal arrival times at the leaves of tree-A can be postulated. They represent primary inputs of the combinational part of the circuit, and such signal arrival times can be obtained from the circuit's environment or from user constraints. Each leaf L of tree-A has no candidate matchings. A load/delay curve can be attached to each leaf of tree-A. Such load/delay curve is any load/delay curve associated with a postulated driver of a primary input that L represents.

A root of tree-A is its output net. At least one candidate from the technology library must match, or the process must stop. An aggregate load/delay curve can be computed for the root of tree-A, e.g., using an algorithm with a recursive procedure like this, Given net node N with candidate matching set C.
Initialize the aggregate load/delay curve of N.
For (each element c of C) {
  For (each leaf node X of c) {
    Let Y be the net node of T corresponding to X.
    Recursively compute the aggregate load/delay curve at Y.
    Look up the load associated with X in the library, and compute the signal arrival time at X, based on the load and the load/delay curve at X.
  }
  The arrival times at each of the leaves of c are now known.
  Compute the arrival time at N as a function of load and the electrical characteristics of the library element that c represents.
  Add the curve so computed to the aggregate load/arrival curve of N.
}

In effect, this algorithm scans the matching candidates of N, and for each candidate "c" computes arrival times at the inputs of "c" under the assumption that "c" will be selected. It can then calculate a load/arrival curve at N from the known characteristics of "c" and consequently the signal arrival times at the inputs of "c". The set of load/arrival curves is generated to represent each of all the possible matchings of cells to N.

The aggregate load/delay curve representations can be made to be efficient. At any load there is a single optimal delay for a particular cell "c". All other members of "c" can do no better than to match the same arrival time for that load. Thus the load/arrival curve at N is preferably a function that maps loads to optimal members of "c". This function can be generated by taking the piecewise minimum of the aggregate load/delay curve.

FIG. 8 illustrates how to make an optimal gate choice in view of a particular capacitive load. The load range for which a gate-G2 is best, is from zero load to the breakpoint. Best is defined as having the shortest signal arrival time (least delay). The load range for which a gate-G1 is best is from the breakpoint to infinity. An aggregate curve at N can be used to find both an arrival time and a best gate to map to N, given the capacitive load being driven.

When starting with an ordered list of trees, the first tree to consider is one driven only by primary inputs. Any succeeding trees will either be driven by primary inputs, or by trees that have already been processed. So every tree-T to be considered in its order is guaranteed to be driven only by primary inputs or trees that have been previously considered. Every driver at the input of a tree-T will have a known Pareto-optimal load/arrival curve at the time tree-T is considered. A Pareto-optimal load/arrival curve is computed for each of the primary outputs of the circuit.

A final step of process 700 (FIG. 7) chooses a load for each output-O. Initially, such load can be chosen arbitrarily, as long as it falls in the range of an aggregate load/arrival curve for output-O. The aggregate curve (e.g., FIG. 8) at output-O maps both the arrival time and the optimal gate G to drive output-O. Setting the load dictates which library gate-G should be selected to drive output-O.

The tree whose root is output-O can be toured, beginning with the inputs of library gate-G. The input capacitances are known, because library gate-G is a known element in the technology library. This allows a simple look-up of the optimal gate to drive each of its inputs. This is repeated until there is a complete covering of tree-T.

If this covering process is applied to the ordered list of trees in reverse order, no tree will be considered unless all of the trees it drives have already been covered. The load on the root gate of that tree is considered. The covering process proceeds until all trees are covered. The technology mapping process is thus completed.

In summary, the selection process sweeps an ordered list of trees. First forward and then backward. In the forward pass, a set of Pareto-optimal load/arrival curves are computed for each net node matching a library element. In the backward pass, the load/arrival curves and load values are used to select a best gate to drive each node considered. Only nodes that correspond to gate inputs are considered. Because of this, loads are always known so the process can be completed.

Several background sources exist that can help with understanding and implementation. A good general reference is, De Micheli, *Synthesis and Optimization of Digital Circuits*, McGraw-Hill 1994. The basic idea of using matching trees and dynamic programming is detailed in Keutzer, *Technology Binding And Local Optimization By DAG Matching*, Proceedings of the 24th Design Automation Conference, IEEE, 1987, page 341. This paper covers the use of matching trees and an area-optimal formulation of the selection problem. It optimizes area and it does not use load/arrival curves. And it uses only a forward pass instead of two passes. Another refinement of matching trees that uses delay/area curves, is described in, Chaudhary, *A Near Optimal Matching Algorithm for Technology Mapping Minimizing Area Under Delay Constraints*, 29th Design Automation Conference, IEEE, 1994. However, in this work Pedram used area/delay curves, and so could not compute the effect of different loads, which is a crucial distinction.

Although the present invention is described herein with reference to the preferred embodiment, one skilled in the art will readily appreciate that other applications may be substituted for those set forth herein without departing from the spirit and scope of the present invention. Accordingly, the present invention should only be limited by the claims included below.

What is claimed is:

1. A technology selection process in an electronic design automation system, comprising the steps of:

partitioning an original circuit design into a set of corresponding logic trees;

ordering said set of corresponding logic trees into an ordered linear list such that each tree-T that drives another ordered tree precedes said other ordered tree, and such that each ordered tree that drives said tree-T precedes said tree-T;

sweeping forward in said ordered linear list while computing a set of Pareto-optimal load/arrival curves for each of a plurality of net nodes that match a technology-library element; and sweeping backward in said ordered linear list while using said set of Pareto-optimal load/arrival curves for each of said net nodes and a capacitive load to select a best one of said technology-library elements with a shortest signal arrival time;

wherein, only net nodes that correspond to a gate input are considered, and any capacitive loads are predetermined.

2. An electronic design automation (EDAM) method, comprising the steps of:

generating an electronic circuit design;

partitioning said electronic circuit design into its constituent blocks and protocol design;

coding said constituent blocks and protocol design in hardware description language (HDL);

using high-level synthesis (HLS) for operation scheduling and resource allocation of said constituent blocks and protocol design;

technology-independent Boolean optimizing said constituent blocks after operation scheduling and resource allocation to produce an intermediate design;

technology-mapping said intermediate design to select particular devices for a hardware implementation of said electronic circuit design;

placing said particular devices at locations in a semiconductor chip; and routing a set of interconnections of said particular devices;

wherein, the step of technology-mapping comprises the sub-steps of:

partitioning an original circuit design into a set of corresponding logic trees;

ordering said set of corresponding logic trees into an ordered linear list such that each tree-T that drives another ordered tree precedes said other ordered tree, and such that each ordered tree that drives said tree-T precedes said tree-T;

sweeping forward in said ordered linear list while computing a set of Pareto-optimal load/arrival curves for each of a plurality of net nodes that match a technology-library element; and sweeping backward in said ordered linear list while using said set of Pareto-optimal load/arrival curves for each of said net nodes and a capacitive load to select a best one of said technology-library elements with a shortest signal arrival time;

wherein, only net nodes that correspond to a gate input are considered, and any capacitive loads are predetermined.

3. The method of claim 2, wherein:

each of said load/arrival curves is computed using a recursive procedure.

4. The method of claim 3, wherein:

each of said load/arrival curves is preferably a function that maps loads to optimal members of said technology-library elements.

* * * * *